US010102996B2

(12) United States Patent
Fiumara et al.

(10) Patent No.: US 10,102,996 B2
(45) Date of Patent: Oct. 16, 2018

(54) METHOD FOR MANUFACTURING A TRENCH CHANNEL FOR VACUUM TRANSISTOR DEVICE AND VACUUM TRANSISTOR DEVICE

(71) Applicant: STMICROELECTRONICS S.R.L., Agrat Brianza (IT)

(72) Inventors: Antonino Fiumara, Aci Castello (IT); Marcello Frazzica, San Giovanni la Punta (IT); Giuseppe Digrazia, Adrano (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 15/392,539

(22) Filed: Dec. 28, 2016

(65) Prior Publication Data

US 2018/0005792 A1 Jan. 4, 2018

(30) Foreign Application Priority Data

Jun. 29, 2016 (IT) ........................ 102016000067595

(51) Int. Cl.

| | |
|---|---|
| ***H01L 29/06*** | (2006.01) |
| ***H01L 29/12*** | (2006.01) |
| ***H01L 21/00*** | (2006.01) |
| ***H01J 19/24*** | (2006.01) |
| ***H01J 19/44*** | (2006.01) |
| ***H01J 9/02*** | (2006.01) |

(52) U.S. Cl.

CPC .............. *H01J 19/24* (2013.01); *H01J 9/025* (2013.01); *H01J 19/44* (2013.01); *H01J 2209/0223* (2013.01)

(58) Field of Classification Search

CPC combination set(s) only.
See application file for complete search history.

(56) References Cited

U.S. PATENT DOCUMENTS

| | | | | |
|---|---|---|---|---|
| 5,203,731 | A | 4/1993 | Zimmerman | |
| 6,194,829 | B1 | 2/2001 | Lu | |
| 9,553,209 | B2 * | 1/2017 | Fiumara .................. | H01J 9/025 |
| 2014/0353576 | A1 | 12/2014 | Patti | |
| 2016/0141428 | A1 | 5/2016 | Fiumara | |

* cited by examiner

*Primary Examiner* — Telly Green
(74) *Attorney, Agent, or Firm* — Seed IP Law Group LLP

(57) ABSTRACT

A method for manufacturing a microelectronic semiconductor device comprising the steps of: forming a trench in a body, the trench having side walls, a opening, and a bottom; forming a sacrificial layer in the trench; forming a recess in the sacrificial layer; forming a restriction structure between the sacrificial layer and the opening of the trench, defining a through hole for access to the sacrificial layer; completely removing the sacrificial layer through said through hole; and depositing a metal layer over the body, thus closing the opening of the trench and forming an electron-emission cathode tip.

20 Claims, 5 Drawing Sheets

METHOD FOR MANUFACTURING A TRENCH CHANNEL FOR VACUUM TRANSISTOR DEVICE AND VACUUM TRANSISTOR DEVICE

BACKGROUND

Technical Field

The present disclosure relates to a method for manufacturing a microelectronic semiconductor device and to the device obtained with said method. More in particular, the present disclosure relates to manufacture of a trench channel for a vacuum transistor device.

Description of the Related Art

In the present context, the term "empty trench" refers to the fact that the trench (or other cavity of any shape) is not filled, irrespective of the conditions of pressure existing within the trench itself.

In semiconductor devices, it is at times desirable to provide an empty trench. For example, vacuum-channel transistor devices are under study, which exploit the operating principle of thermionic valves, and are further known by the terms VMDs (Vacuum Microelectronic Devices), or UVTs (Ultra-Vacuum Transistors). In these devices, a deep trench is present having an internal vacuum pressure (e.g., $10^{-5}$ torr) closed at the top by a metal layer, for example aluminum, operating as cathode or electron-emitter or ion-emitter element.

An example of embodiment of an empty-trench microelectronic device is described, for example, in the patent document US 2014/353576 and is schematically illustrated in FIG. 1.

With reference to FIG. 1, an empty-trench device 1 comprises a substrate 2 of heavily doped semiconductor material, such as silicon, a stack 3 of layers 4-6, which extends over the substrate 1, a trench or hole 10, which extends throughout the thickness of the stack 3, as far as the substrate 1, and a cathode metal region 11, which extends over the stack 3 and closes the trench 10 at the top. The trench 10 is here in conditions of negative pressure, and is thus defined as "vacuum hole".

The stack 3 of layers here comprises a first insulating layer 4 over the substrate 2, a conductive layer 5, for example, of polycrystalline silicon, and a second insulating layer 6, over the conductive layer 5. The conductive layer 5 has the function, when appropriately biased, of electrode for controlling electron emission by the cathode, modulating the electrical extraction field.

A contact structure 12 is formed over the cathode metal region 11, and an anode metal layer 13 extends underneath the substrate 2.

A passivation layer 15, of silicon nitride, coats the side walls of the trench 10.

The device 1 is obtained by depositing the layers 4-6 in sequence on the substrate 2 and then chemically removing selective portions of the layers 4-6 using a photolithographic process and appropriate etching chemistries. Next, the passivation layer 15 is deposited in a highly conformable way in the trench 10 and shaped for removing it from the bottom of the trench 10 and from the front of the device 1. Then a metal layer is deposited in a non-conformable way and shaped lithographically, for example an aluminum layer, which closes the trench 10 at the top and forms the cathode metal region 11.

In the practical embodiment of the device, there have been noted difficulties in deposition of the metal layer that is to form the cathode metal region 11. In fact, even using non-conformable material and deposition techniques, not always is it possible to guarantee that the metal will not penetrate sensibly into the trench 10. On the other hand, the presence of metal particles inside the trench is disadvantageous, given that possible metal traces in the trench 10 may give rise to leakage that may not be readily distinguished from the emissions of the cathode metal region, thus determining a not always correct operation of the device.

In order to overcome the aforementioned problem, the patent document US 2016/141428 provides a solution that envisages the step of allowing deposition of etch reaction by-products on the inner walls of the trench up to formation of a restriction element in the proximity of the opening of the trench. In this way, thanks to the presence of the restriction element, the device thus formed does not present any intrusion of metal into the trench. However, the reaction products of a polymeric type that are formed according to said teaching are not commonly used in electronic devices, and their stability over time, during use of the device, should be evaluated.

BRIEF SUMMARY

At least some embodiments of the present disclosure are a method and a device that are alternative to the ones of the prior art and that overcome the drawbacks of the prior art.

According to the present disclosure, a method for manufacturing a microelectronic semiconductor device and the device obtained with said method are provided.

In practice, according to one aspect of the present disclosure, to prevent entry of metal material into the trench, a partial obstruction of the entrance of the trench is formed through a restriction structure suspended in at the top opening of the trench, which may serve at the same time as restriction element designed to prevent intrusion of metal into the trench and as definition of a sharp emitter cathode, i.e., one having an optimal shape for emission of charges during operation of the device.

BRIEF DESCRIPTION OF THE SEVERAL VIEWS OF THE DRAWINGS

For a better understanding of the present disclosure, a preferred embodiment thereof is now described, purely by way of non-limiting example, with reference to the attached drawings, wherein.

DETAILED DESCRIPTION

The method described according to the present disclosure regards provision of a microelectronic semiconductor device, with vacuum trench, such as a diode, a triode, a tetrode, a pentode, or other device having a similar basic structure.

FIGS. 2-10 show a view in lateral section, during successive manufacturing steps, of a microelectronic semiconductor device represented in a triaxial system of mutually orthogonal axes X, Y, and Z. The view of FIGS. 2-10 is taken along the plane XZ.

Initially (FIG. 2), provided on a substrate 31 of heavily doped semiconductor material, for example monocrystalline silicon, is a stack 32 of layers. The ensemble formed by the substrate 31 and the stack 32 constitutes a body 30 that forms part of a wafer.

The substrate 31 is typically of an N type, for example doped with phosphorus, and has a resistivity of approximately 18 mΩ·cm.

Figure 1:
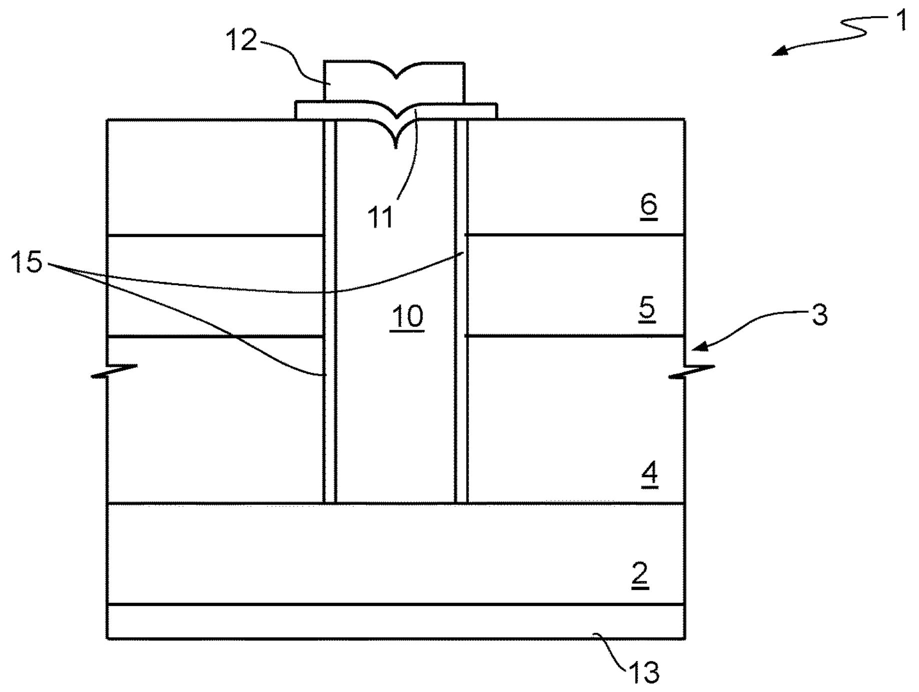
Fig.1 (Prior Art)
FIG. 1 is a cross-sectional view through a vacuum microelectronic device of a known type.
Figure 2:
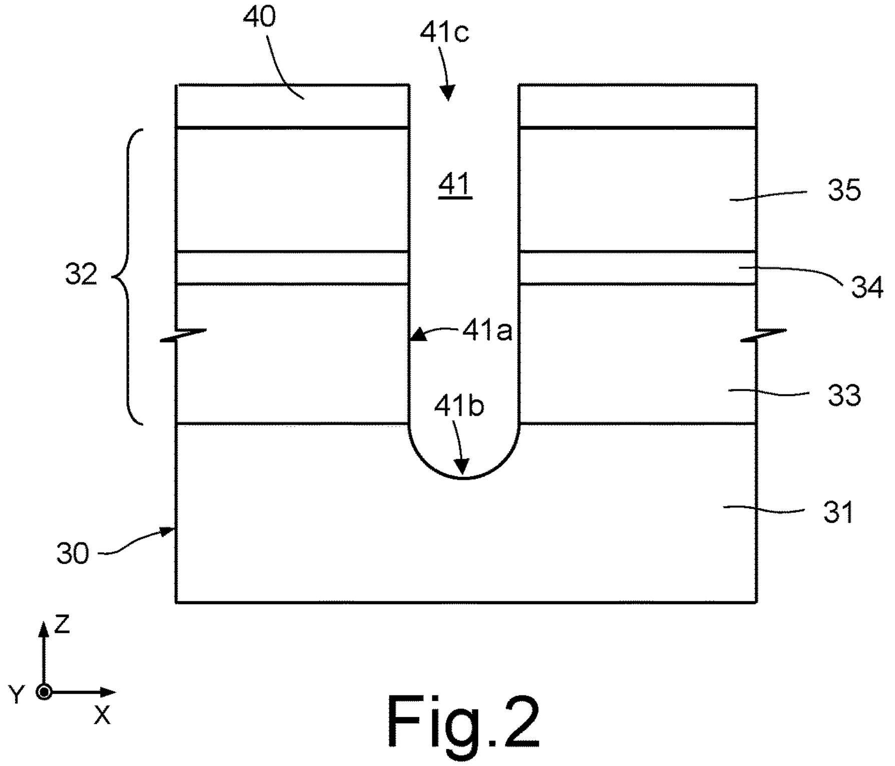
FIGS. 2-10 show cross-sectional views through a wafer of semiconductor material in successive steps of manufacture of an empty-trench microintegrated device, according to one embodiment of the present disclosure.
Figure 3:
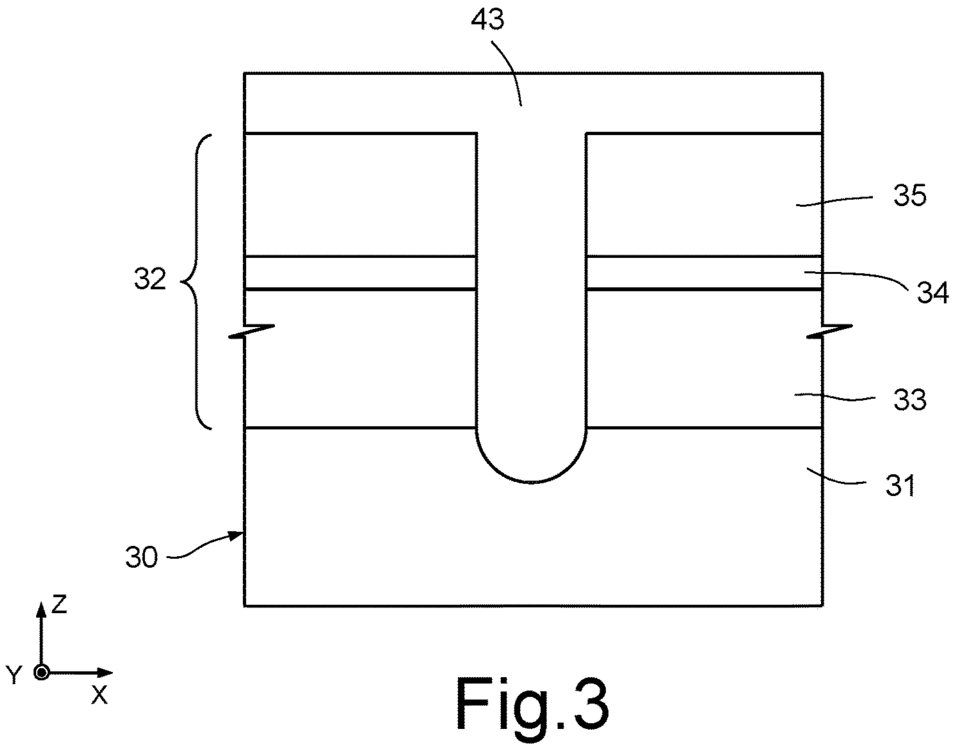
Figure 4:
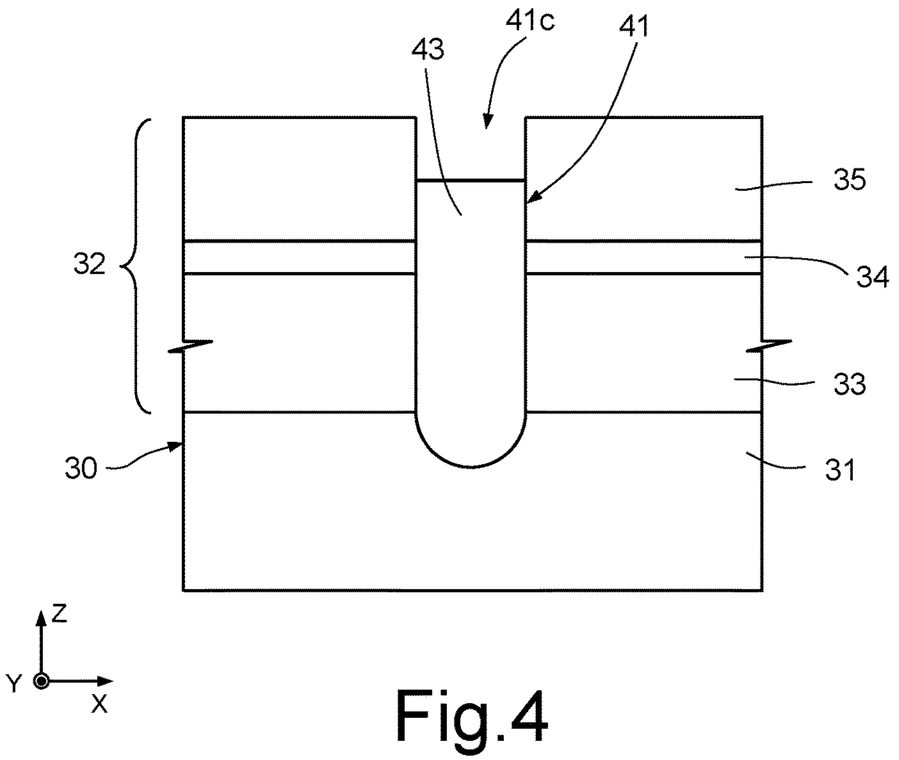
Figure 5:
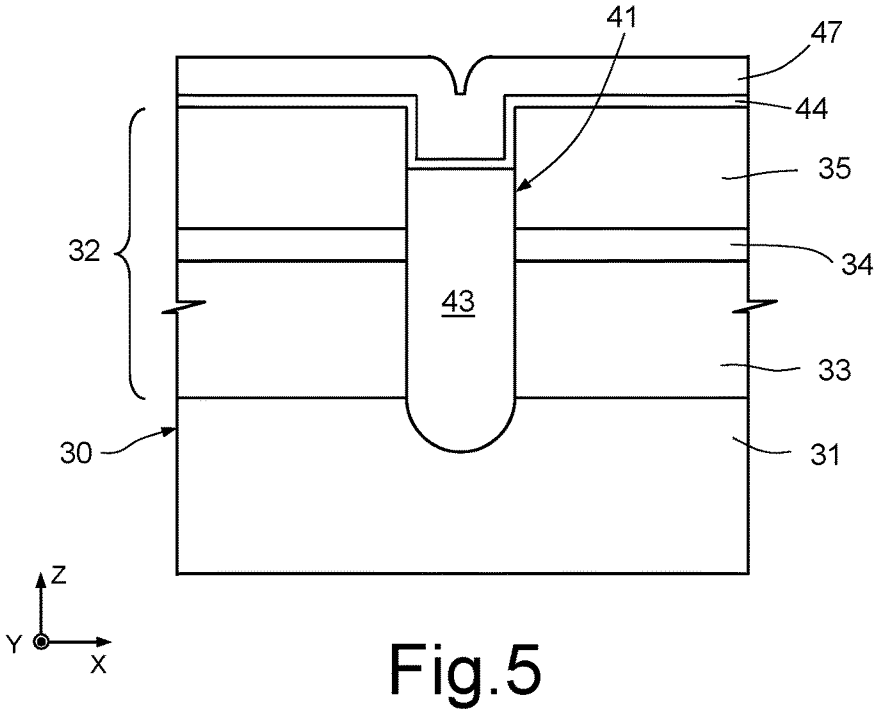
Figure 6:
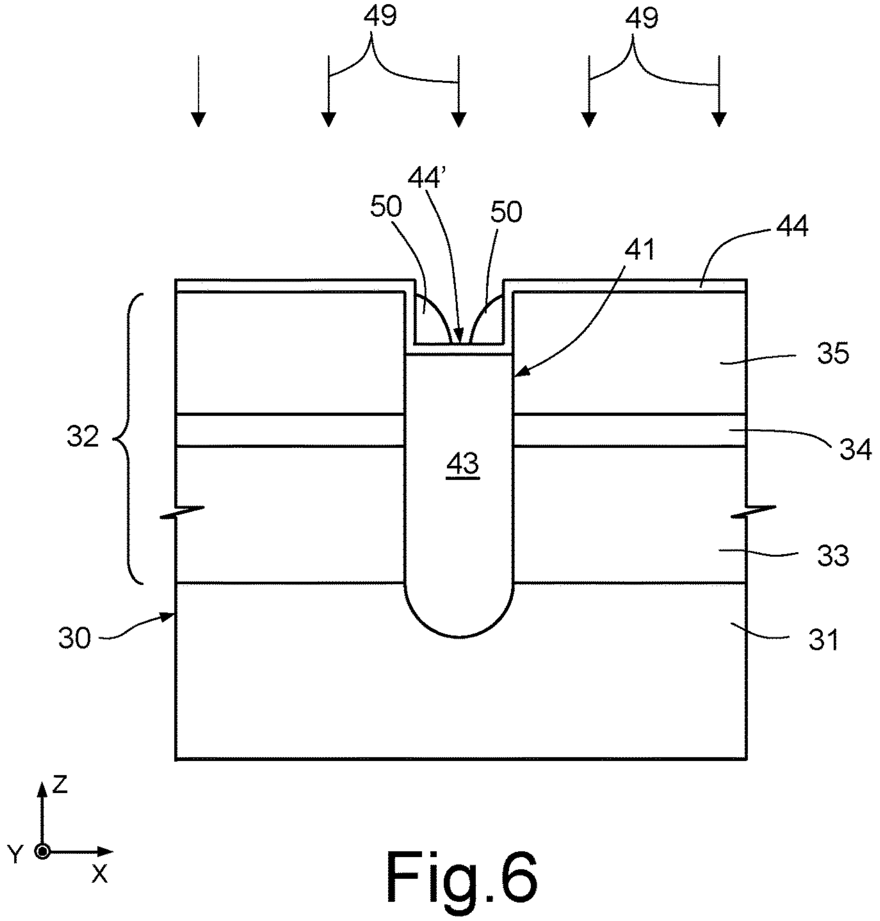
Figure 7:
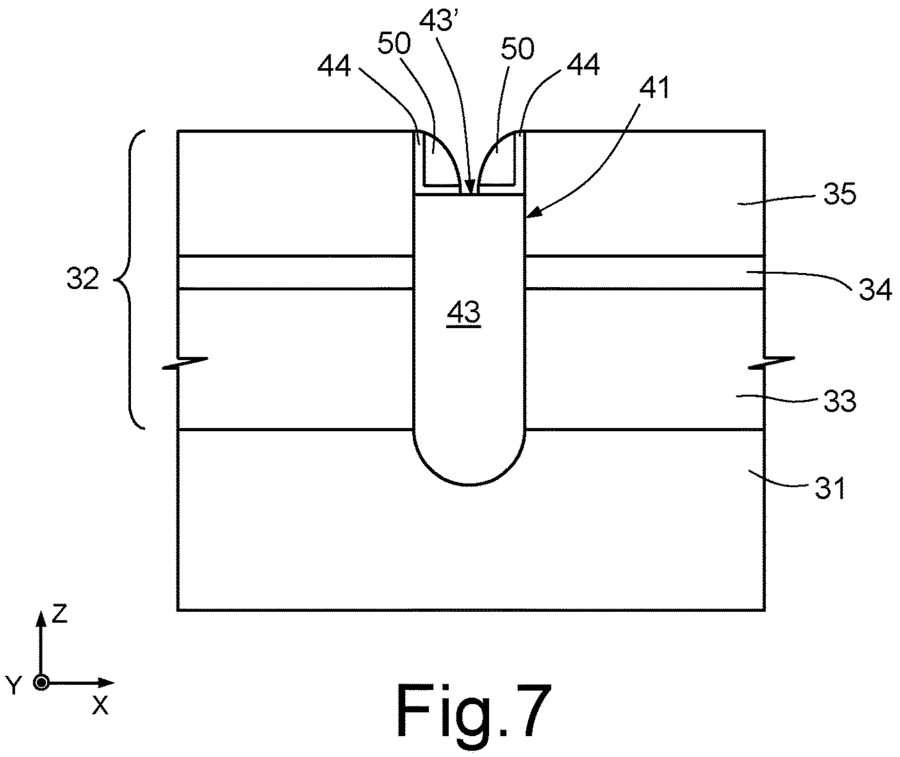
Figure 8:
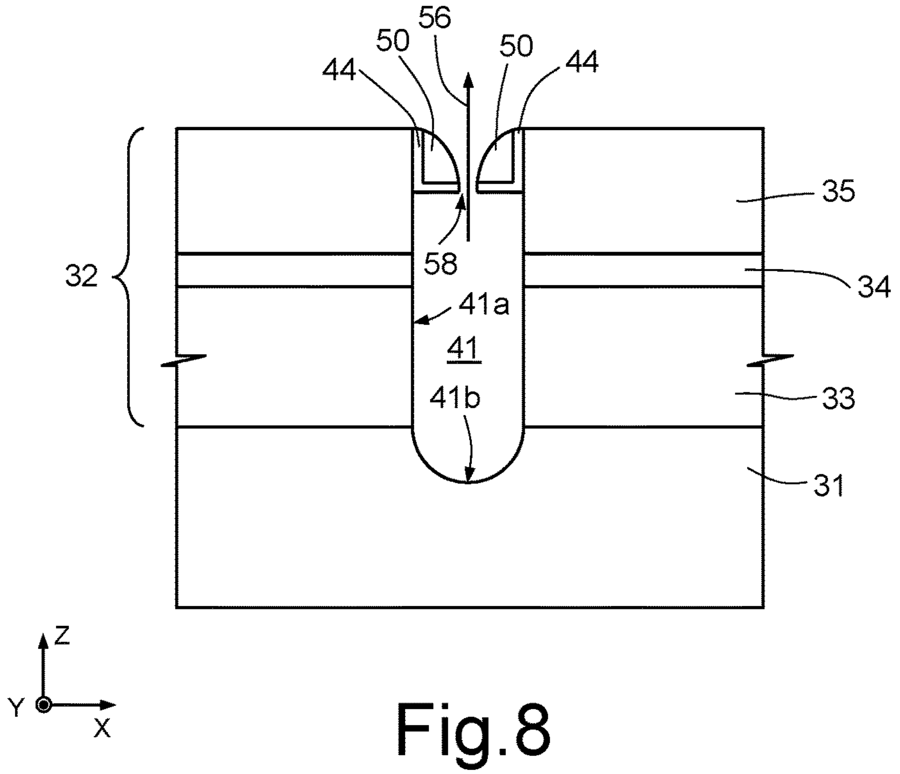
Figure 9:
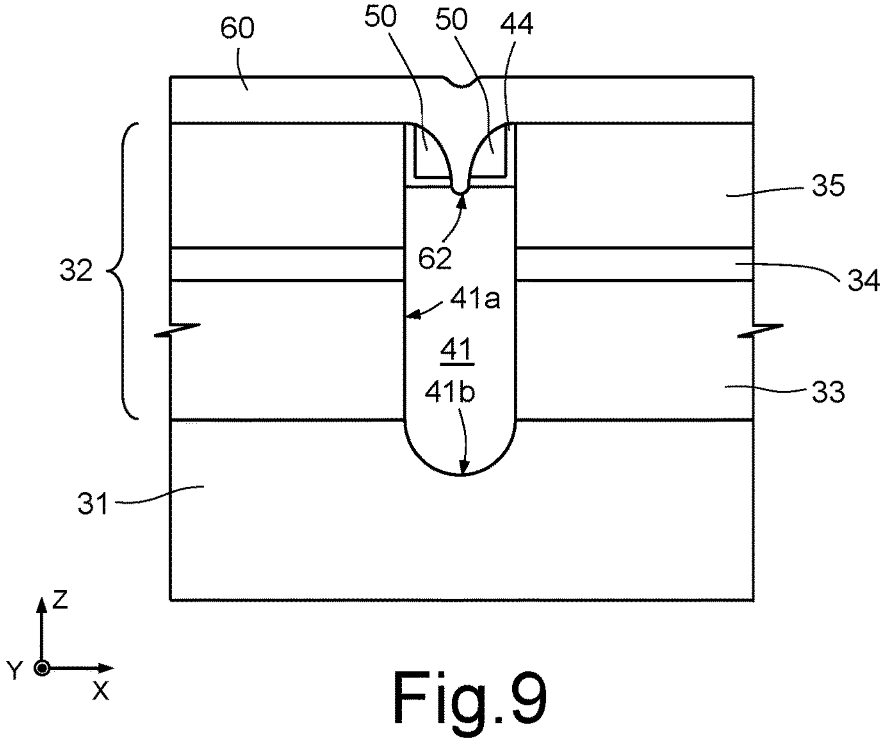
Figure 10:
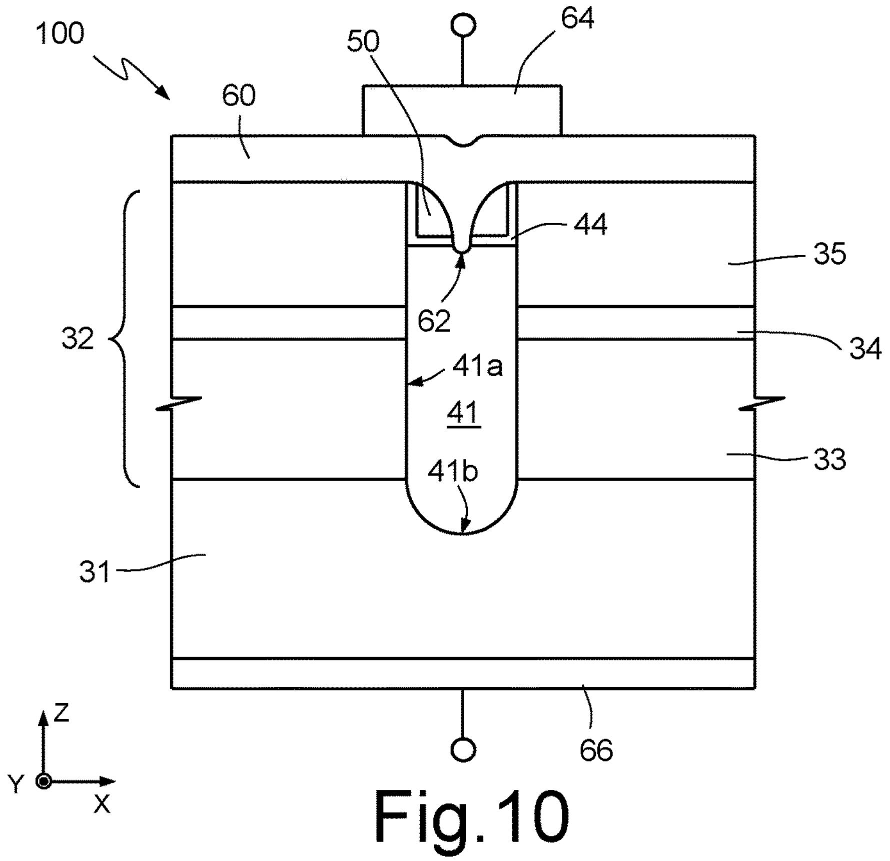

The stack 32 here comprises a first insulating layer 33, a conductive layer 34, and a second insulating layer 35, in a way similar to what has been described with reference to FIG. 1.

For example, the first insulating layer 33 is made of TEOS (Tetra-Ethyl-Ortho Silicate) formed by CVD (Chemical Vapor Deposition) with a thickness comprised between 500 and 1000 nm, for example, 500 nm.

The conductive layer 34 is made, for example, of conductive material such as polycrystalline silicon of an N type, doped with phosphorus and having a thickness comprised between 50 nm and 300 nm, for example, 100 nm. The conductive layer 34 is, for example, deposited via PECVD (Plasma-Enhanced Chemical Vapor Deposition) and may have a resistivity comprised between 10 and 100 mΩ·cm.

The second insulating layer 35 is made, for example, of TEOS, which is also deposited via CVD and has a thickness comprised between 500 nm and 1000 nm, for example, 500 nm.

Thus, the stack 32 has as a whole a thickness comprised between 1100 nm and 2000 nm, for example, 1200 nm.

Next, formed on the stack 32 is a masking layer (for example, of photoresist), which is shaped photolithographically for forming a mask 40 having an opening 38 of a shape and a width that are the same as the ones desired for a trench 41 to be obtained in subsequent manufacturing steps. For example, the opening 38 may have a circular shape with a diameter comprised between 400 nm and 700 nm, for example, approximately 600 nm.

Then, using the mask 40, an etch is carried out, with selective removal of the layers that form the stack 32 and of part of the substrate 31. In particular, RIE (Reactive Ion Etching) is carried out, using appropriate etching chemistries according to the materials to be removed.

Any possible polymeric by-products that form during the plasma-etch reaction are expelled and removed from the structure being defined, by appropriate choice of the pressure and flow of the etching gas, so that they do not deposit on the walls of the structure being formed. Removal of possible etching by-products may further occur by washing steps, as is clear to the person skilled in the art.

The trench 41 is thus formed, which extends completely through the insulating layers 33 and 35, completely through the conductive layer 34, and partially in the substrate 31, terminating in the substrate 31. According to one aspect of the present disclosure, the trench has a depth, measured in the vertical direction X, of 1100 nm.

According to a different embodiment, not shown in the figures, the trench 41 extends completely through the insulating layers 33 and 35 and the conductive layer 34, reaching the surface of the substrate 31 without penetrating therein, or penetrating into the substrate for a few nanometers or a few tens of nanometers.

The trench 41 has side walls 41*a*, a bottom 41*b*, and a opening 41*c*. The opening 41*c* of the trench 41 is defined on the insulating layer 35, whereas the bottom 41*b* is defined on the substrate 31.

Next (FIG. 3), the etching mask 40 is removed, and a step of formation of a sacrificial layer is carried out, by a step of deposition or growth of an appropriate material. For example, polymeric material, designated in FIG. 3 by the reference number 43, in particular photoresist, is deposited over the insulating layer 35 and inside the trench 41. According to one aspect of the present disclosure, deposition of the photoresist is carried out up to complete filling of the trench 41.

This step entails formation of a thick photoresist layer 43 also over the wafer being processed, i.e., over the insulating layer 35. To reduce the thickness of the photoresist layer 43 on the wafer without removing or jeopardizing the photoresist that fills the trench 41, there is envisaged a step of photoexposure of the photoresist layer 43 in the absence of masking and with an exposure energy lower than the minimum dose that can be used for complete crosslinking of the photoresist layer that extends over the wafer. In other words, the exposure energy is such that the photoresist can be removed in solvent solution for a fraction of its total thickness on the wafer, and not completely (for example, for a thickness, measured along Z starting from the insulating layer 35, of approximately 50 nm).

Then, a step is carried out of bath in a solvent solution (e.g., resist edge remover (RER)) to remove the photoresist layer 43 exposed. It is thus possible to eliminate a fair part of the photoresist layer 43 from the surface of the wafer, leaving unaltered the photoresist 43 for filling the trench 41. In this step, it is not necessary, albeit desirable, to remove the photoresist completely from the surface of the wafer. It is in any case preferable to adjust the parameters of exposure of the photoresist layer 43, according to the step previously described, for having a margin of tolerance such as to guarantee preservation of the photoresist 43 in the trench 41.

Then (FIG. 4), a step of thermal curing of the photoresist layer 43 is carried out in order to enable complete evaporation of the volatile components thereof (e.g., solvents) so that the subsequent process steps at high temperature will not generate, in the photoresist layer 43, bubbles or structural modifications thereof. The curing step is carried out at a temperature comprised between 300 and 360° C., for example, 340° C., using a ramp of 1 hour to pass from 30° C. to 340° C. and subsequent maintenance for another hour at 340° C.

Next, a step of etching of the photoresist layer 43 is carried out to remove it completely from the front of the wafer and in part from the trench 41, partially emptying it.

For this purpose, a dry etch is carried out, in particular a plasma etch based upon oxygen ($O_2$) as sole etching chemistry.

For example, to carry out etching, the etching platform Centure® DPS (Decoupled Plasma Source) may be used set with: a working pressure of 32 mtorr; a source peak power, for plasma ignition, of 500 W; a peak power for biasing of the substrate, to obtain directionality of movement of the active species, of 100 W; a He gas pressure, to guarantee thermal contact between the back of the wafer and the chuck, of 10 torr; and a flow of $O_2$ gas of 80 sccm.

The etch is configured, as has been said, for emptying the trench 41 partially, and in particular for removing the photoresist inside the trench 41 until a negative pressure is reached, along Z, comprised within the thickness of the insulating layer 35, for example approximately half the thickness of the insulating layer 35.

Then (FIG. 5), there follows a step of deposition of a conformable silicon-nitride layer, having the function of etch-stop layer 44. The etch-stop layer 44 thus extends on the inner walls of the partially emptied region of the trench 41, on the photoresist layer 43 in the trench 41, and on the front of the wafer. The etch-stop layer 44 has a thickness comprised between 50 nm and 100 nm, for example, 70 nm.

Next, an insulating layer 47 is formed, for instance, by growing TEOS oxide, on the etch-stop layer 44. In the case of growth of TEOS, the etch-stop layer 44, of SiN, further has the function of seed layer. The insulating layer 47 has a thickness comprised between 150 nm and 400 nm, more in particular between 250 nm and 300 nm.

Then (FIG. 6), the insulating layer 47 is etched by anisotropic dry etching, for example using an etching chemistry in $CF_4/CHF_3$ by plasma RIE technique.

Said etching step is carried out for removing completely the insulating layer 47 from the front of the wafer except for portions of the insulating layer 47 adjacent to the side walls of the trench 21. The anisotropic dry etch is such that the insulating layer 47 is removed at a higher rate at portions of the latter orthogonal to the etching direction (here, the etching direction is along Z, as indicated by the arrows 49), whereas portions of the insulating layer 47 substantially longitudinal to the etching direction (i.e., the portions of the insulating layer 47 lying in the plane XY) are removed at a lower rate.

Along the side walls of the trench 41, a collar element 50 is thus formed having a profile that is crowned or roughly shaped like a quarter of a torus. In cross-sectional view, the collar element 50 has a shape tapered along Z such that the lateral thickness, measured along X, of the collar element 50, decreases moving away from the trench 41 in the positive direction of the axis Z. In particular, the collar element 50 has a base side adjacent to the etch-stop layer 44 having a dimension, measured along X, approximately equal to the thickness chosen for the insulating layer 47 (e.g., between 150 nm and 400 nm). More in particular, the diameter of the trench 41 and the thickness of the insulating layer 47 are chosen such that, after the etching step just described, the collar element 50 delimits internally a surface portion 44' of the etch-stop layer 44 having a diameter comprised between 0.1 μm and 0.3 μm, preferably between 0.15 μm and 0.2 μm. The shape, in the plane XY, of the surface portion 44' of the etch-stop layer 44 is defined substantially by the shape, in the plane XY, chosen for the trench 41.

Etching of the insulating layer 47 thus stops at the etch-stop layer 44. A subsequent etching step (FIG. 7) enables removal of the etch-stop layer 44 from the wafer and inside the trench 41 exclusively at the portion thereof not protected by the collar element 50, i.e., at the surface portion 44'. A surface region 43' of the photoresist layer 43 that fills partially the trench 41 is thus exposed. The collar element 50 protects, during this etching step, portions of the etch-stop layer 44 extending underneath it. These portions of the etch-stop layer 44 are thus not removed.

Next (FIG. 8), complete emptying of the trench 41 is carried out by removing the photoresist layer 43 through the opening 58 formed in the etch-stop layer 44. This step is carried out using an etching technique of the "plasma downstream" type, which is a dry-etching technique that enables, according to the chemistry used, a high-temperature etch of an isotropic type. The etch is carried out, for example, at a temperature comprised between 200° C. and 300° C., using an etching chemistry in $O_2/N_2H_2$. The photoresist 43 reacts, at the temperature of the chamber, with the etching chemistry and vaporizes, coming out of the trench 41 as represented schematically by the arrow 56. The by-products generated by etching of the photoresist 43, given that they are highly volatile, are removed by the vacuum-generation system of the etching chamber.

Next (FIG. 9), a cathode layer 60 is deposited. For example, a layer of aluminum or titanium is deposited, with a thickness of approximately 1.5 μm with a non-uniform deposition technique, typically CVD.

By appropriately modulating the etching conditions, the collar element 50 prevents entry of the metal into the trench 41. Further, the collar forms a sort of "mold" that enables definition, through the opening 58, of the tip-shaped or cusp-shaped cathode 60, which optimizes performance of the finished device. In fact, thanks to the shape of the collar 50, the cathode layer 60 does not penetrate sensibly into the trench 41 and forms a sharp portion 62 in the proximity of the opening of the trench 41 itself.

In the case where a device is to be formed in which the trench is in a condition of negative pressure or vacuum, deposition of the cathode layer 60 may take place in a high-vacuum environment, for example, with a pressure comprised between $10^{-3}$ and $10^{-8}$ torr, as example $10^{-5}$ torr.

Finally (FIG. 10), the cathode layer 60 is defined, in a per se known manner and not shown in the figure, and over the cathode layer 60 a cathode contact 64 is provided. On the back of the substrate 31, an anode contact 66 is instead provided. There is thus obtained a vacuum-trench device 100. There may follow the usual passivation steps.

The method described and the finished device thus obtained present numerous advantages.

In fact, thanks to the presence of the restriction element, or collar, 50, the trench device 100 does not present intrusions of metal into the trench 41. Further, the cathode layer 60 has a tip-shaped portion 62 having an optimal shape for emission of charges during operation of the device 100.

Finally, it is clear that modifications and variations may be made to the method and to the device described and illustrated herein, without thereby departing from the scope of the present disclosure.

For instance, even though the example described refers to provision of a trench in a stack of layers, the same approach may be followed for providing openings and cavities even in single layers.

The trench may further have any shape.

As has been mentioned, the number of etching steps may vary according to the specific conditions. In the case of successive etches followed by washing, the etching steps may be carried out with different parameters. In particular, in the first etching step or steps, the parameters may be standard, with automatic removal of the by-products, if so desired.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectronic semiconductor device comprising:

a body;

a trench which extends in the body, the trench having side walls, an opening, and a bottom;

a restriction structure, which extends in the trench, adjacent to the opening of the trench, the restriction structure extending from the side walls of the trench surrounding the opening and defining a through hole; and a metal layer over the body, the metal layer penetrating in, and contacting, the through hole and forming an electron-emission tip.

2. The device according to claim 1, wherein the restriction structure extends from the opening of the trench towards the bottom of the trench for a distance, measured along the side walls of the trench, comprised between 0.4 μm and 0.6 μm.

3. The device according to claim 1, wherein the restriction structure has a rounded portion facing the metal layer, the electron-emission tip extending within the rounded portion of the restriction structure.

4. The device according to claim 1, wherein the body comprises a substrate of semiconductor material, a first insulating layer and a second insulating layer over the substrate, and a conductive layer between the first and second insulating layers, said trench extending through the first insulating layer, the conductive layer, and the second insulating layer as far as the substrate.

5. The device according to claim 4, being a vacuum transistor, wherein the metal layer forms a cathode region and the substrate forms an anode region of the vacuum transistor.

6. The device according to claim 1, wherein the trench has an internal pressure comprised between $10^{-3}$ and $10^{-8}$ torr.

7. A microelectronic semiconductor device comprising:

a body;

a trench which extends in the body, the trench having side walls, an opening, and a bottom;

a restriction structure that extends in the trench, adjacent to the opening of the trench, and defining a through hole, the restriction structure including:

a first insulating layer having a lateral portion, lining upper portions of the sidewall of the recess, and a bottom portion extending inwardly from the lateral portion; and an annular second insulating layer having a lateral sidewall contacting the later portion of the first insulating layer and a bottom wall contacting the bottom portion of the first insulating layer; and a metal layer extending through the through hole and forming an electron-emission tip.

8. The device according to claim 7, wherein the restriction structure extends in the trench to a depth that is less than half way towards the bottom of the trench.

9. The device according to claim 7, wherein the second insulating layer has a rounded portion facing the metal layer, the electron-emission tip extending within the rounded portion.

10. The device according to claim 7, wherein the body comprises a substrate of semiconductor material, a third insulating layer and a fourth insulating layer over the substrate, and a conductive layer between the third and fourth insulating layers, said trench extending through the third insulating layer, the conductive layer, and the fourth insulating layer as far as the substrate.

11. A microelectronic semiconductor device made by a method comprising:

forming a trench in a body, the trench having side walls, an opening, and a bottom; and forming a sacrificial layer completely filling of the trench;

forming a recess in the sacrificial layer, releasing the opening of the trench;

forming a restriction structure between the sacrificial layer and the opening of the trench, said restriction structure defining a through hole that forms a path for accessing the sacrificial layer from the opening;

removing the sacrificial layer through said through hole; and depositing a metal layer over the body, the metal layer closing the opening of the trench.

12. The device according to claim 11, wherein:

the body has a front side and a back side, said opening of the trench being defined at the front side, forming the sacrificial layer including carrying out a process of deposition or growth on the front side and in the trench, forming the recess in the sacrificial layer including carrying out an etch to completely remove portions of the sacrificial layer on the front side and continuing the etch to remove partially the sacrificial layer in the trench starting from the opening thereof, thus forming said recess.

13. The device according to claim 11, wherein forming the sacrificial layer includes depositing a photoresist.

14. The device according to claim 11, wherein forming the restriction structure includes:

forming an etch-stop layer in the recess;

forming an annular element between the etch-stop layer and the opening of the trench, the annular element having an opening defining the through hold; and removing portions of the etch-stop layer exposed through the through hole.

15. The device according to claim 14, wherein forming the annular element includes:

forming, on the etch-stop layer, a conformable structural layer having a thickness of less than half a diameter of the opening;

carrying out an anisotropic etch of the conformable structural layer to remove regions of the conformable structural layer that extend orthogonal to the side walls of the trench until portions of the etch-stop layer are exposed.

16. The device according to claim 13, wherein removing the sacrificial layer comprises removing the sacrificial layer completely from inside the trench.

17. The device according to claim 13, wherein removing the sacrificial layer through the through hole includes:

carrying out an isotropic dry etch of the photoresist, generating volatile components; and removing the volatile components through the through hole.

18. The device according to claim 11, wherein:

the body comprises a substrate of semiconductor material, a first insulating layer and a second insulating layer over the substrate, and a conductive layer between the first and second insulating layers, and forming the trench includes removing selective portions of the first insulating layer, the conductive layer, and the second insulating layer and exposing the substrate.

19. The device according to claim 11, wherein depositing the metal layer over the body to close the opening of the trench includes occluding the through hole by forming a sharpened portion of the metal layer through the through hole.

20. The device according to claim 11, wherein depositing the metal layer is carried out in vacuum conditions, thus forming a vacuum transistor device.

* * * * *